(12) United States Patent
Hatakeyama et al.

(10) Patent No.: US 9,029,848 B2
(45) Date of Patent: May 12, 2015

(54) ORGANIC ELECTROLUMINESCENT PANEL AND METHOD FOR PRODUCING THE SAME

(75) Inventors: Takuya Hatakeyama, Kawasaki (JP); Takahito Oyamada, Kawasaki (JP)

(73) Assignee: Pioneer Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/124,663

(22) PCT Filed: Jun. 9, 2011

(86) PCT No.: PCT/JP2011/063217
§ 371 (c)(1), (2), (4) Date: Jan. 24, 2014

(87) PCT Pub. No.: WO2012/169033
PCT Pub. Date: Dec. 13, 2012

(65) Prior Publication Data
US 2014/0197391 A1     Jul. 17, 2014

(51) Int. Cl.
*H01L 29/08*     (2006.01)
*H01L 27/32*     (2006.01)
*H01L 51/00*     (2006.01)
*H01L 51/56*     (2006.01)
*H01L 51/52*     (2006.01)
*H01L 51/50*     (2006.01)

(52) U.S. Cl.
CPC ........ *H01L 27/3246* (2013.01); *H01L 51/0005* (2013.01); *H01L 51/5012* (2013.01); *H01L 51/56* (2013.01); *H01L 51/0081* (2013.01); *H01L 51/0085* (2013.01); *H01L 2251/308* (2013.01); *H01L 51/5209* (2013.01)

(58) Field of Classification Search
None
See application file for complete search history.

(56) References Cited

U.S. PATENT DOCUMENTS

| 6,727,871 B1 | 4/2004 | Suzuki et al. |
| 2003/0044639 A1 | 3/2003 | Fukuda |
| 2004/0155575 A1 | 8/2004 | Suzuki et al. |
| 2005/0236629 A1* | 10/2005 | Lee et al. ............. 257/79 |
| 2006/0125363 A1 | 6/2006 | Tahira et al. |

FOREIGN PATENT DOCUMENTS

| JP | 2000-323277 A | 11/2000 |
| JP | 2001-110575 A | 4/2001 |
| JP | 2003-0044639 A | 3/2003 |

(Continued)

OTHER PUBLICATIONS

International Search Report (ISR) (PCT Form PCT/ISA/210), in PCT/JP2011/063217, dated Jul. 5, 2011.

*Primary Examiner* — Kyoung Lee
(74) *Attorney, Agent, or Firm* — McGinn IP Law Group, PLLC

(57) ABSTRACT

A method for producing an organic electroluminescent panel having an organic layer formed by a coating step and a large aperture ratio includes: a first step of arraying and distributing a plurality of first electrodes on or above a substrate; a second step of forming stacking bodies each composed of a plurality of organic-emitting layer on the top face of each of the first electrodes; and a third step of forming organic electroluminescent elements by forming second electrodes respectively on or above the stacking bodies. In the first step, a conductive body having an angled edge portion forming a edge line surrounding the top face itself is used. The second step includes a step of supplying at least a liquid having a light-emitting organic material that is ejected from a nozzle and supplied in a fine flow shape to the organic layer on the top face.

7 Claims, 6 Drawing Sheets

(56) References Cited

FOREIGN PATENT DOCUMENTS

| JP | 2004-527088 A | 9/2004 |
| JP | 2007-154176 A | 6/2007 |
| JP | 2010-504608 A | 2/2010 |
| JP | 2010-061951 A | 3/2010 |
| WO | WO 2004-030417 A1 | 4/2004 |

* cited by examiner

ORGANIC ELECTROLUMINESCENT PANEL AND METHOD FOR PRODUCING THE SAME

TECHNICAL FIELD

The present invention relates to an organic electroluminescent panel (hereinafter referred to as organic EL panel) in which a plurality of organic electroluminescent elements (hereinafter referred to as organic EL elements) are distributed, for example, in a matrix shape or in a strip shape, and a method for producing the same.

BACKGROUND ART

Each of the organic EL elements has a plurality of organic layers (organic material layers) made of an organic compound having charge-transporting properties between an anode and a cathode, and is a luminus element containing at least one light-emitting layer in the organic layers.

There has been known a method for producing an organic EL panel which includes a step of forming a bank (organic insulator film, or the like) on a substrate to partition areas for respective organic EL elements and a step of painting the areas for respective light-emitting layers and organic layers with different liquids by an inkjet method in which a liquid containing organic materials is ejected from a nozzle and supplied in a fine flow shape to each of the areas.

For example, Patent Literature 1 discloses bank structures which each define the periphery of at least one well and in which one or more of a charge-transporting material, a charge-injecting material, a light-filtering material, and a light-emitting material are disposed. The bank structures are each a structure which defines the periphery of at least one electrode and does not extend to the periphery of an adjacent electrode.

Patent Literature 2 discloses a bank structure in which an intermediate groove is disposed between banks of adjacent EL elements to prevent liquids from mixing with each other.

CITATION LIST

Patent Literatures

Patent Literature 1: Japanese Patent Application Laid-Open No. 2010-504608
Patent Literature 2: Japanese Patent Application Laid-Open No. 2004-527088

SUMMARY OF INVENTION

Technical Problem

In order to prevent liquids to be separately applied by an inkjet method from mixing with each other, a bank is disposed so as to surround an electrode on a light extraction side of an organic EL element and subjected to a water repellent treatment, or a liquid-repellent bank is formed. Thus, the applied liquid does not spread beyond a light-emitting area. In order to impart water repellency to a bank, the surface of the bank is coated with fluorine. When a lyophilic bank is coated with fluorine, it is known that a gas containing fluorine is decomposed by plasma with a vacuum plasma device or an atmospheric-pressure plasma device to coat the surface of the bank with fluorine.

In order to thus form a water-repellent bank on a substrate side in this manner, the number of steps is increased. Further, it is known that a fluorine-containing water-repellent bank is used. In this case, there may be problems of patterning properties and a residue. In particular, the presence of a residue results in problems of leak and abnormal film thickness due to water repellency of the residue.

In order to cope with the problems, a method for separately coating lyophilic banks will be considered. However, when a coating liquid applied is spread over each of the lyophilic banks, the coating liquids may be mixed on adjacent cells. Therefore, it is difficult that the coating liquid is separately applied to the lyophilic banks by a wet coating method.

FIG. 1 shows a process for producing an organic EL panel in accordance with a conventional inkjet method. A substrate 1 made of glass or the like is first prepared, and an anode 2 made of ITO or the like and an auxiliary electrode BU are formed on the substrate (FIG. 1(a)). An insulation bank BK is formed so as to surround the anode 2 in a photolithography step (FIG. 1(b)). A coating liquid Lq that is a material solution constituting an organic layer is applied to the inside of an aperture defined by the bank BK (FIG. 1(c)). After that, the coating liquid is dried to form an organic layer LY (FIG. 1(d)). The steps of applying and drying corresponding coating liquids are successively repeated according to each organic layer satisfying a function, to form a multi-layered organic layer MLY (FIG. 1(e)). After the formation of the organic layer, a cathode metal film 9 is formed by vapor deposition or the like (FIG. 1(f)). Subsequently, a sealing step not shown in the drawings is performed to obtain an organic EL panel.

In the conventional method for producing an organic EL panel as described above, a bank BK is necessary. For example, when the sub-pitch Sp for organic EL elements is 500 µm and the width BKW of a bank BK is 100 µm, the width OW of an aperture is 400 µm, and the aperture ratio (OW/Sp) is 80%.

The present invention has been made under the circumstances. An object of the present invention is to provide an organic EL panel including an organic layer formed by a coating step while having a high aperture ratio and, and a method for producing the same.

Solution to Problem

The present inventor has investigated to achieve the above-described object, and as a result, found that the behavior of a coating liquid is restricted by the shape of an electrode. A bank between elements is eliminated by the use of a specifically shaped electrode for an organic EL element. Thus, the present invention has been completed.

The method for producing an organic electroluminescent panel according to the present invention includes: a first step of arraying and distributing a plurality of first electrodes on or above a substrate; a second step of forming stacking bodies each composed of a plurality of organic layers including a light-emitting layer on or above respective top faces of the first electrodes; and a third step of forming organic electroluminescent elements by forming second electrodes respectively on or above the stacking bodies. In the method for producing an organic electroluminescent panel, the first electrode is formed in the first step so as to be a conductive body having an angled edge portion forming a edge line surrounding the top face itself, and the second step includes a step of supplying at least a liquid having a light-emitting organic material that is ejected from a nozzle and supplied in a fine flow shape to the organic layer on the top face.

The organic electroluminescent panel according to the present invention comprises organic electroluminescent elements, wherein the organic electroluminescent elements include a plurality of first electrodes that are arrayed and formed on a substrate; stacking bodies each including a plurality of organic layers that are stacked on the top face of each of the first electrodes and include a light-emitting layer; and second electrodes formed on the respective stacking bodies. In the organic electroluminescent element, each of the first electrodes is a conductive body having an angled edge portion forming a edge line surrounding the top face itself, and the light-emitting layer is formed of dried material derived from at least a liquid having a light-emitting organic material that is ejected from a nozzle and supplied in a fine flow shape to the organic layer on the top face.

DESCRIPTION OF EMBODIMENTS

Hereinafter, an embodiment of the present invention will be described with reference to the drawings.

Figure 1:
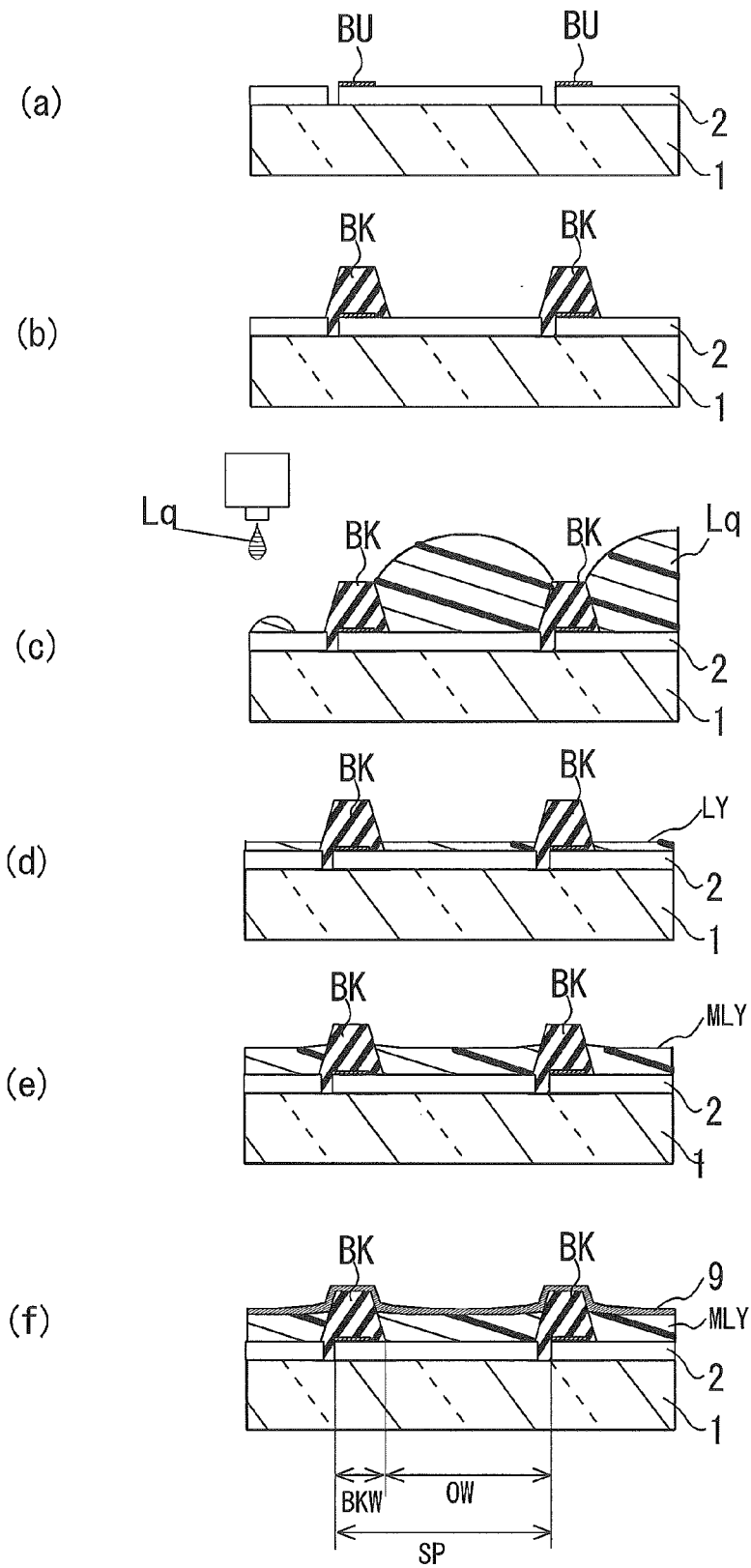
FIG. 1 is a cross-sectional view of part of an intermediate production structure of an organic EL panel obtained by steps in the conventional process for producing an organic EL panel.
Figure 2:
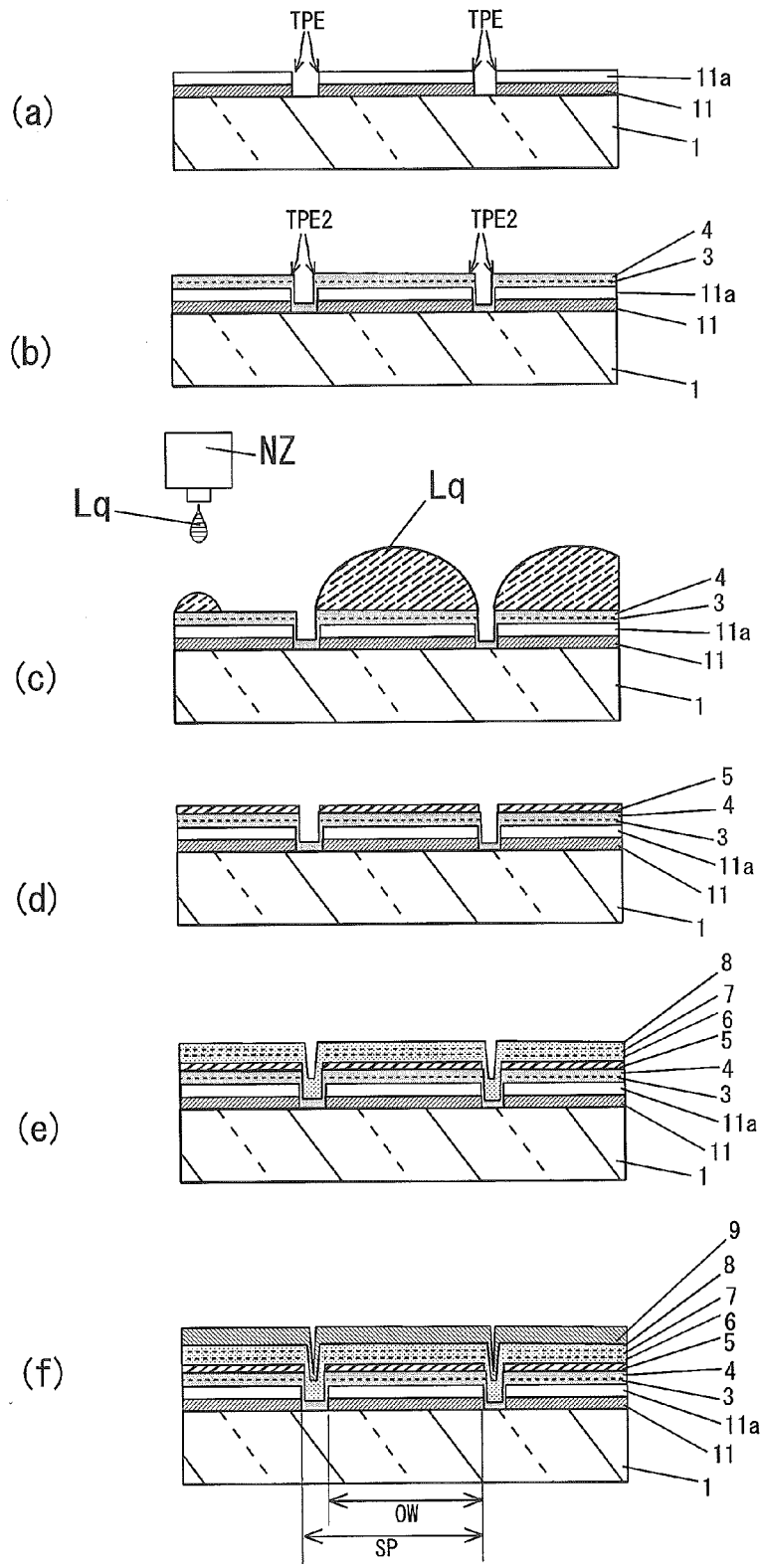
FIG. 2 is a cross-sectional view of part of an intermediate production structure of an organic EL panel obtained by steps in a process for producing an organic EL panel in an embodiment according to the present invention.

FIG. 2 shows an intermediate production structure of an organic EL panel obtained by steps in a process for producing an organic EL panel as a first embodiment.

As shown in FIG. 2(a), a substrate 1 made of glass or the like is first prepared, and a conductive film made of aluminum or the like and a conductive film made of ITO or the like are formed in turn by a sputtering step. Subsequently, a photolithography step in a predetermined pattern such as a striped pattern or a rectangular island pattern is performed to form a plurality of conductive bodies in which a first electrode 11 and a first auxiliary electrode (anode) 11a are layered on the substrate 1 so that the conductive bodies are arrayed and distributed. In the step of forming conductive bodies, an angled edge portion TPE is formed on the periphery of the first auxiliary electrode 11a. Therefore, the angled edge portion TPE forming a edge line surrounding the top face itself of the first auxiliary electrode 11a is formed. The angled edge portion TPE has an inner angle of 45° to 165°. For example, an angled edge portion having an inner angle of 90° is formed.

A coating liquid for a hole injection layer is applied to the entire surfaces of the first auxiliary electrode 11a and the substrate 1, for example, by a wet coating method such as a spin coating method and a slit coating method, and dried to form a hole injection layer 3. To the entire surface of the layer, a coating liquid for a hole transport layer is applied and dried to form a hole transport layer 4 (FIG. 2(b)). A edge line TPE2 that surrounds the top face itself of the hole transport layer 4 and has a figure similar to the angled edge portion TPE on the periphery of the first auxiliary electrode 11a is formed on the hole transport layer 4. In the step of applying an organic layer, the hole injection layer 3 and the hole transport layer 4 that each spread over a distribution region of the first electrode 11 and are each an organic layer made of a non-light-emitting organic material are formed. However, these layers may be omitted or only one layer may be formed depending on an element configuration.

Subsequently, a coating liquid for a light-emitting layer Lq, that is, a liquid having a light-emitting organic material is applied to the top face of the hole transport layer 4 that is surrounded by the edge line TPE2 by an inkjet method in which a liquid is ejected from a nozzle and supplied in a fine flow shape (FIG. 2(c)). In the inkjet step, for example, a nozzle NZ is caused to move along the array of the first electrodes 11 relative to the substrate 1. The coating liquid for an light-emitting layer is ejected from the nozzle NZ, and supplied to the top face of the hole transport layer 4 in a fine flow shape that is a fine drop. The coating liquid Lq is maintained at a contact angle by the surface tension, for example, in a hemispheroidal swelling shape.

After that, the coating liquid for a light-emitting layer is dried to form a light-emitting layer 5 (FIG. 2(d)).

Subsequently, a material for a hole blocking layer is subjected to a vacuum vapor deposition method to form a hole blocking layer 6 on the light-emitting layer 5, a material for an electron transport layer is subjected to a vacuum vapor deposition method to form an electron transport layer 7 on the hole blocking layer, and a material for an electron injection layer is subjected to a vacuum vapor deposition method to form an electron injection layer 8 on the electron transport layer (FIG. 2(e)).

Next, a cathode 9 that is a second electrode made of aluminum or the like is formed on the electron injection layer 8 by a vacuum vapor deposition method (FIG. 2(f)). After that, a sealing step not shown in the drawings is performed to obtain an organic EL panel. As the sealing step, a barrier film formed by plasma CVD or the like may be sealed with a solid or sealed with a hollow body such as a glass can.

According to the present embodiment, a bank is unnecessary, and therefore the process of producing an organic EL element can be simplified, and the aperture width OW relative to the sub-pitch Sp of respective organic EL elements can be significantly secured. Accordingly, the aperture ratio (OW/Sp) can be improved.

Figure 3:
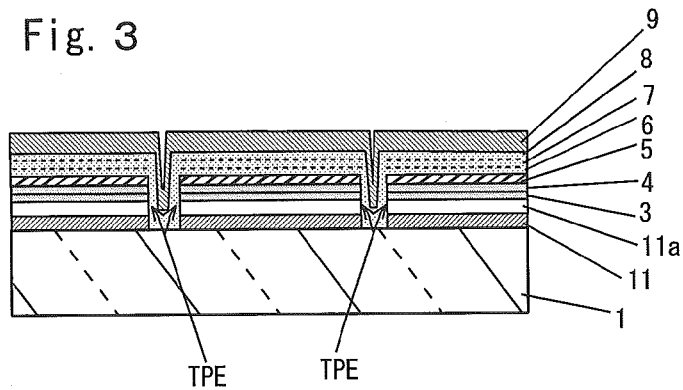
FIG. 3 is a schematic partial cross-sectional view of an organic EL panel obtained by the process for producing an organic EL panel in another embodiment according to the present invention.

FIG. 3 shows an organic EL panel obtained by forming a hole injection layer, a hole transport layer, and a light-emitting layer by an inkjet method as a second embodiment.

An aluminum film for a first electrode is first formed on a substrate 1 by a sputtering method.

An ITO film for an anode (first auxiliary electrode) is then formed on the aluminum film by a sputtering method.

Subsequently, the aluminum film and the ITO film are patterned by a photolithography method, to form a first electrode 11 and an anode 11a that have the same shape and an angled edge portion on the periphery. The angled edge portion forms a edge line surrounding the top face itself.

Next, a hole injection layer 3, a hole transport layer 4, and a light-emitting layer 5 are each formed in turn by applying respective coating liquids in the same pattern as in the first electrode by an inkjet method followed by drying. Since a edge line surrounding the top face itself caused by the angled edge portion TPE on the periphery of the anode (first auxiliary electrode) is formed on the hole injection layer and the hole transport layer, patterning by the inkjet method is available.

Subsequently, a hole blocking layer 6 is formed on the entire surface by any coating method.

An electron transport layer 7 and an electron injection layer 8 are then formed by vapor deposition.

Next, a cathode 9 that is a second electrode made of aluminum is formed by resistance heating vapor deposition. After that, the sealing step is performed to obtain an organic EL panel of the second embodiment.

When coating layers are thus formed as a multilayer, all layers having been patterned on an electrode may be formed by coating on the electrode, or only an arbitrary layer may be formed, and other layers may have a configuration in which the electrode and a part other than the electrode are covered.

In a third embodiment, an organic EL panel is formed in the same configuration as in the first embodiment except that a cathode 9 that is a second electrode in the first embodiment is made of silver (Ag) instead of aluminum by resistance heating vapor deposition. By using Ag (semi-transparent electrode material) for a cathode (second electrode), an organic EL panel having a top emission structure can be produced. Since light is not emitted from a substrate side due to the top emission structure, a thickness and a shape of the first electrode which are likely to cause a pinning effect can be selected. When the thickness of Ag film of the second electrode is 75 nm or less, the transmittance of the second electrode is 80% or more. In the first and second embodiments, when silver (Ag) is used for the first electrode instead of aluminum, an organic EL panel of bottom emission type having a transmittance of 80% or more can be produced.

Figure 4:
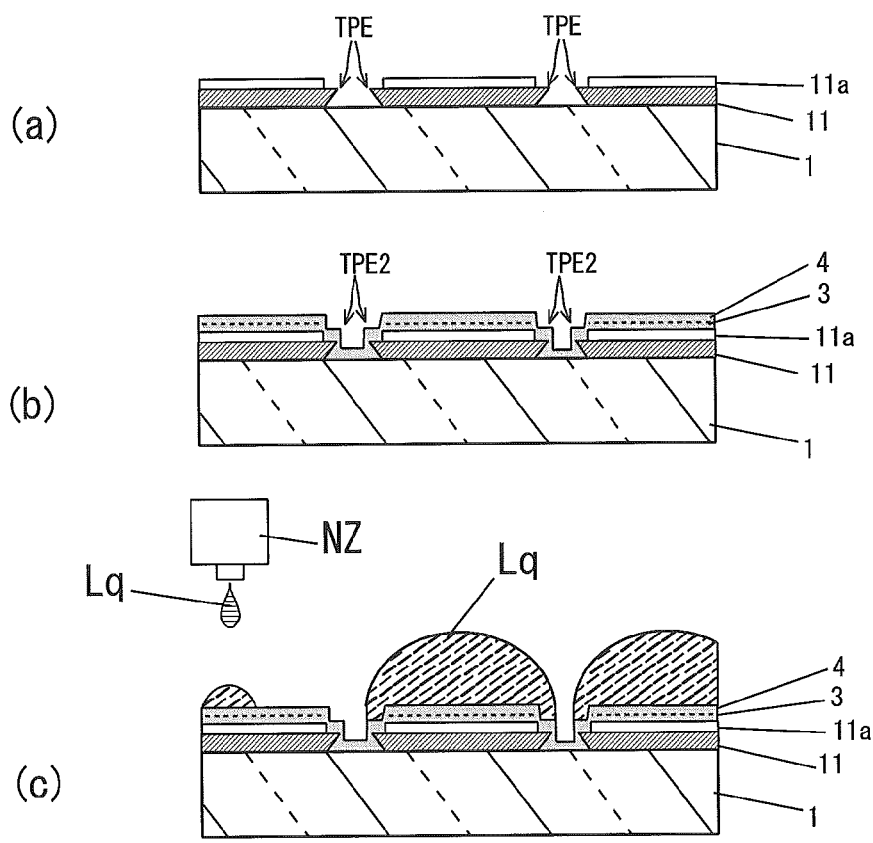
FIG. 4 is a schematic partial cross-sectional view of an organic EL panel obtained by the process for producing an organic EL panel in still another embodiment according to the present invention.

FIG. 4 shows an example of a light-emitting layer formed by the same inkjet method as in the first embodiment except that the configuration of a first electrode 11 and an anode 11a is changed and a second electrode is made of Ag, as a forth embodiment. Since steps after the light-emitting layer forming step are the same as in the first embodiment, the description thereof is omitted.

An aluminum film for a first electrode is first formed on a substrate 1 by a sputtering method.

Subsequently, the aluminum film is patterned by a photolithography method, to form a first electrode 11 having an angled edge portion on the periphery.

An ITO film for an anode (first auxiliary electrode) is then formed on the first electrode 11 by a sputtering method.

After that, the ITO film is patterned by a photolithography method as shown in FIG. 4(a), to form an anode 11a having an area smaller than that of the first electrode 11 so that the angled edge portion on the periphery of the first electrode 11 is exposed. The patterning of the first electrode is performed so that the pattern of the first electrode is larger than that of the anode. In a step of forming the first electrode and the anode, the first electrode 11 and the anode 11a that are each a conductive body is not restricted to formation thereof into two layers. The first electrode and the anode may be formed as a multi-layered body so that the angled edge portion TPE on the periphery is exposed and the area of the top face of a conductive film among a plurality of conductive films is larger than that of the other conductive films.

A coating liquid for a hole injection layer is applied to the entire surfaces of the first electrode 11, the first auxiliary electrode 11a, and the substrate 1, and dried to form a hole injection layer 3, as shown in FIG. 4(b). To the entire surface of the layer, a coating liquid for a hole transport layer is applied and dried to form a hole transport layer 4 (FIG. 4(b)). A edge line TPE2 that is based on the angled edge portion TPE on the periphery of the first electrode 11 is formed on the hole transport layer 4.

Subsequently, a coating liquid for a light-emitting layer is applied in the same pattern as that of the first electrode 11 to the top face of the hole transport layer 4 that is surrounded by the edge line TPE2 as shown in FIG. 4(c) by an inkjet method (FIG. 4(c)). In this case, aluminum or the like that has good processability is used as the first electrode 11 that is an underlying layer and in a pattern having a large area, and ITO or the like that has poor processability is used as the first auxiliary electrode 11a that is an upper layer and in a pattern having a smaller area. Therefore, even when the coating liquid Lq does not stop at the edge of the ITO upper layer, the coating liquid Lq can stop at the edge of the angled edge portion TPE of the underlying aluminum layer. Steps after this step are the same as in the first embodiment.

In all embodiments, when the inkjet method is used, each coating liquid Lq can be various types of organic material-containing liquid that contains an organic material constituting an organic layer such as a hole injection layer, a hole transport layer, a light-emitting layer, a hole blocking layer, an electron transport layer, or an electron injection layer, and is prepared in advance as an ink.

For the anode 11a, a conductive material having a work function higher than that of the cathode 9 is selected. Further, when the anode and the cathode are located on the light extraction side, materials for and thicknesses of the anode and the cathode are selected so that the anode and the cathode are transparent or semi-transparent. In particular, it is preferable that one or both of the anode and the cathode be made of a material having a transmittance of at least 80% or more in the wavelength of light emitted from the light-emitting organic material. The layering order of the organic layers may be opposite to the order of the embodiments, or an order from a cathode of an electron injection layer, an electron transport layer, a hole blocking layer, a light-emitting layer, a hole transport layer, a hole injection layer, and an anode.

Next, a preferred range of inner angle of angled edge portion TPE of the conductive film according to this embodiment in practical terms will be described.

Figure 5:
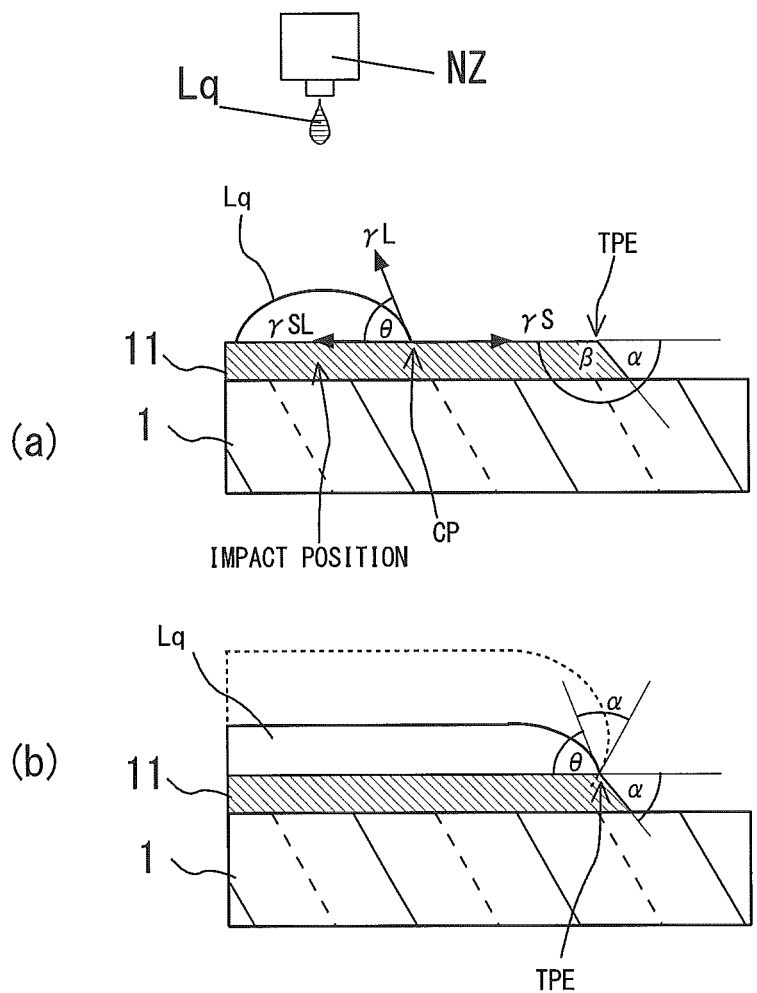
FIG. 5 is a schematic partial cross-sectional view of a sample substrate illustrating a state where a droplet of a coating liquid adheres to a first electrode.

As shown in FIG. 5, a sample substrate in which a first electrode 11 that is an ITO conductive film having an angled edge portion TPE is formed on a glass substrate 1 is prepared. A coating liquid Lq is applied to the top face (planar surface) of the first electrode 11 on the substrate 1, for example, by the inkjet method of a wet film-forming method. In this case, the coating liquid Lq can be various types of coating liquid for an organic layer that contains an organic material constituting an organic layer such as a hole injection layer, a hole transport layer, a light-emitting layer, a hole blocking layer, an electron transport layer, or an electron injection layer, and is prepared in advance as an ink. FIG. 5(a) shows a schematic partial cross-sectional view of the sample substrate in an equilibrium state in which a droplet of the coating liquid impacts and adheres to the first electrode 11. FIG. 5(b) shows a schematic partial cross-sectional view of the sample substrate in a state in which a plurality of droplets of the coating liquid impact and a film of aggregated coating liquid adheres to the entire surface of the first electrode 11.

In FIG. 5(a), the droplet of the coating liquid Lq is maintained by the surface tension in a hemispheroidal swelling shape. As shown in the drawings, this is because a contact point CP of the first electrode 11, the coating liquid Lq, and the air, satisfies a Young's equation: $\gamma S = \gamma SL + \gamma SL \cdot \cos\theta$ and the equilibration is maintained. In the equation, $\gamma S$ represents a surface tension of a solid (first electrode), $\gamma SL$ represents a surface tension of an interface of solid and liquid phases (surface tension of an interface of the first electrode and the coating liquid), $\gamma L$ represents a surface tension of liquid (coating liquid), and $\theta$ represents a contact angle. When the contact angle satisfies $0° \leq \theta 90°$, the first electrode is lyophilic to the coating liquid. When the contact angle satisfies $90° < \theta 180°$, the first electrode is lyophobic to the coating liquid. In consideration of adhesion of the coating liquid to the first electrode and movement of droplets of the coating liquid, the properties of the coating liquid are set so as to satisfy $0° \leq \theta \leq 90°$, and the coating liquid is prepared.

In FIG. 5(b), the coating liquid Lq is applied to the first electrode 11 in such a total amount that a film of the coating liquid Lq does not pass through the angled edge portion TPE of the first electrode 11.

The angled edge portion TPE of the first electrode 11 has a tapered angle $\alpha$ (that is an angle between an extended surface and a side edge surface of the top face, or an angle that slopes from the top face of the first electrode towards the substrate, and satisfies a relationship with an inner angle $\beta$ of $\alpha + \beta = 180°$). Therefore, when the film of the coating liquid Lq is close to the angled edge portion TPE, the film does not spread beyond the angled edge portion TPE, and the contact point is fixed on the angled edge portion TPE, resulting in so-called wet pinning phenomenon. In the embodiment, this pinning phenomenon is utilized. Thus, when the contact angle of the coating liquid Lq on the top face of the first electrode 11 is $\theta$ and the tapered angle at the angled edge portion TPE is $\alpha$, the coating liquid Lq does not spread beyond the angled edge portion until the contact angle at the angled edge portion TPE reaches $\theta + \alpha$. This is because the contact angle on the tapered surface beyond the bent first electrode 11 is smaller than the contact angle $\theta$ on the top face when the coating liquid spreads beyond the angled edge portion TPE. In accordance with the Young's equation, the contact angle of the coating liquid Lq on the angled edge portion TPE may have any value of $\theta$ to $\theta + \alpha$.

The pinning effect in which the coating liquid Lq stops at the angled edge portion TPE can be thus utilized to control wet spreading of the coating liquid Lq on the top face of the first electrode 11.

The present inventor has examined a suitable range of a tapered angle $\alpha$ at the angled edge portion TPE that can achieve the pinning effect by an experiment.

As shown in FIG. 5, a plurality of sample substrates 1 provided with a first electrode 11 having a certain area are produced so that the tapered angle $\alpha$ is changed to be any of 2°, 15°, and 20°, and droplets of a coating liquid are applied to an impact position within a range of from the angled edge portion TPE (0 μm) to 100 μm by an inkjet method. The impact distance of the droplets is changed, and the probability of occurrence of a case where the coating liquid does not spread beyond the angled edge portion TPE and stays (pinning effect) at each time is determined. The relationship between the probability of occurrence of pinning and the impact distance from the edge is examined.

Figure 6:
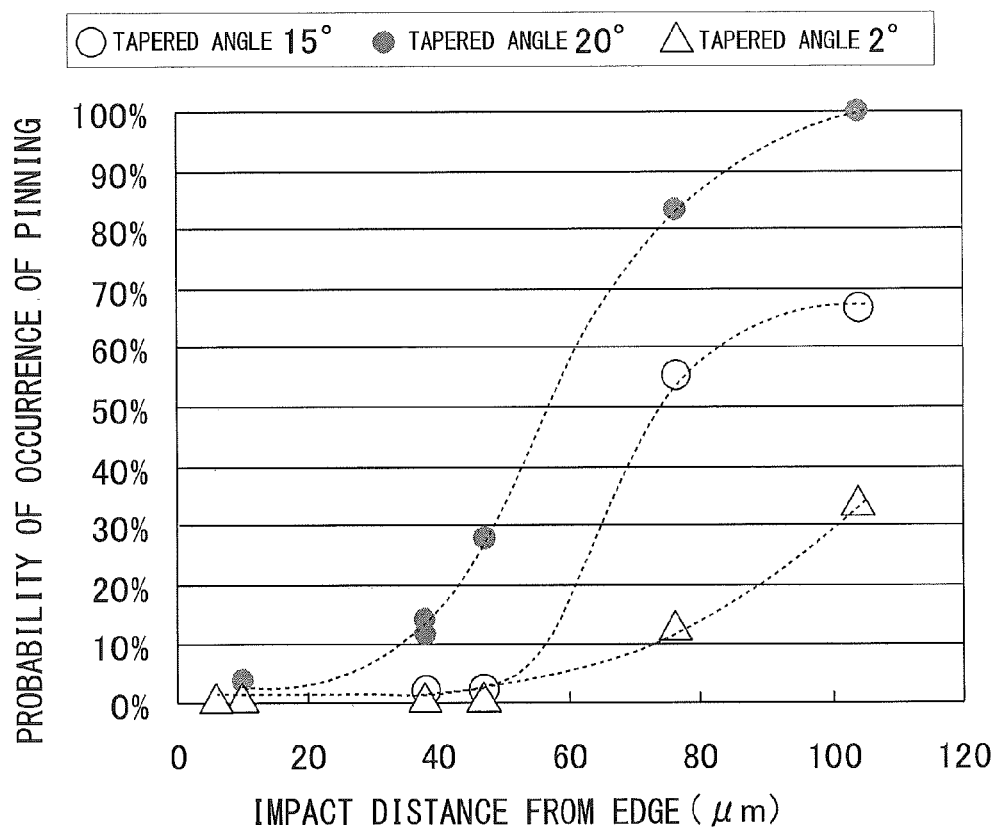
FIG. 6 is a graph showing a relationship of a distance between an angled edge portion and an impact position of the coating liquid and a probability of occurrence of a pinning phenomenon, according to the present invention.

FIG. 6 is a graph showing an experimental result of the probability of occurrence of pinning. It is clear from FIG. 6 that there is a significant difference of the pinning effect depending on the tapered angle, for example, a smaller tapered angle is unlikely to cause a pinning effect, and a larger tapered angle is likely to cause a pinning effect. In sample substrates having an angled edge portion with tapered angles of 15° and 20°, when the impact distance of the droplet from the edge exceeds 60 μm, dramatic improvement in the probability of occurrence of pinning is verified from FIG. 6. In the embodiment, as a useful range of pinning effect, the angled edge portion has a tapered angle $\alpha$ of 15° or more. When the tapered angle $\alpha$ is 15°, the area of the tapered surface from the angled edge portion is too large, the distance between adjacent elements becomes longer, and the aperture ratio is not sufficient. Therefore, the thickness of the first electrode is suitably 1,000 nm or less. When the thickness of the first electrode is as thin as less than 50 nm, the area of the tapered surface from the angled edge portion is small, and the shape of the angled edge portion is not clear. Further, in order to secure a wiring having a low resistance, the thickness of the first electrode is suitably 50 nm or more.

The present inventor has examined the upper limit of tapered angle $\alpha$ at the angled edge portion by producing a plurality of substrates having a first electrode in which a side wall on the periphery has a so-called reversed tapered shape.

Figure 7:
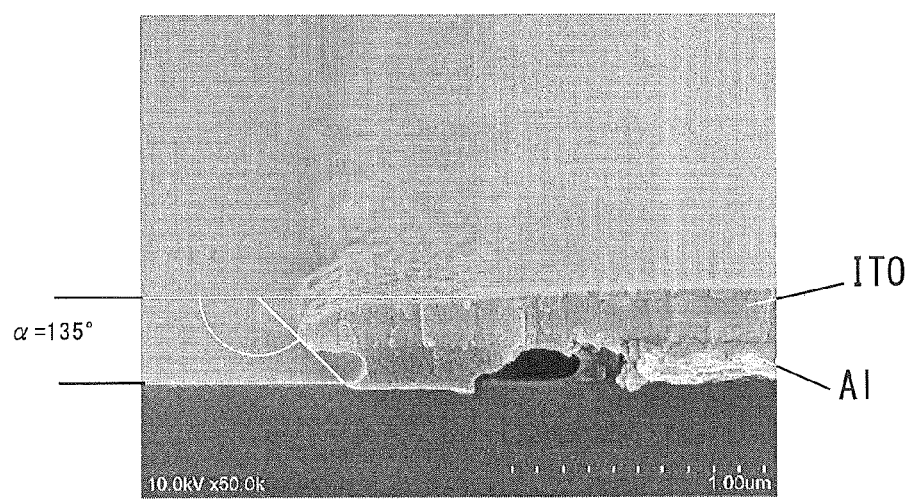
FIG. 7 is a scanning electron microscopy (SEM) photograph of a cross section of a sample substrate having a first electrode with a two-layered electrode structure (with the lower layer being Al, and the upper layer being ITO).

When a first electrode having a reversed tapered shape is formed using a multi-layered electrode structure or by anisotropic etching, a sample substrate of which a tapered edge part may be broken by a physical contact during a washing step or the like is increased. When the tapered angle exceeds 135° as shown in a SEM photograph of a cross section of a sample substrate having a first electrode with a two-layered electrode structure (with the lower layer being Al, the upper layer being ITO) in FIG. 7, the angled edge portion of the first electrode is broken, and the manufacturing yield is reduced. Therefore, a first electrode having a tapered angle $\alpha$ of 135° or less at the angled edge portion is preferably utilized.

Accordingly, the present inventor has provided a tapered angle of 15° to 135°, that is, an angled edge portion with an inner angle of 45° to 165°, on a first electrode on the substrate of an organic EL panel.

Figure 8:
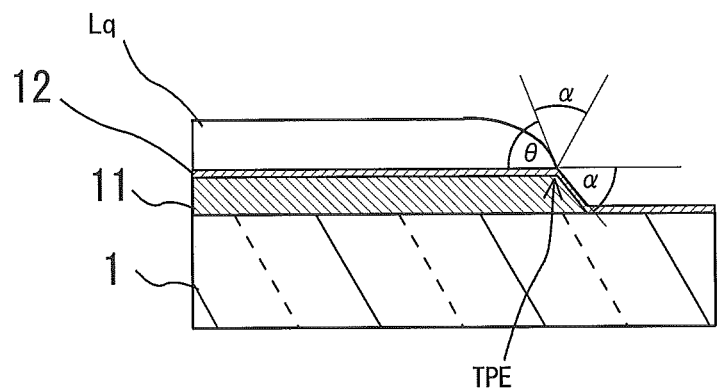
FIG. 8 is a schematic partial cross-sectional view of a sample substrate in which an underlying organic layer is formed on the entire surfaces of the first electrode and the substrate.

The present inventor has made a sample substrate in which as shown in FIG. 8, a first electrode 11 having an angled edge portion TPE is formed on a substrate 1 and an underlying organic layer 12 is formed in advance on the entire surfaces of the first electrode 11 and the substrate 1 by a wet coating method such as a slit coating method. As confirmed from the experiment results, the pinning effect of the coating liquid Lq is maintained at the angled edge portion TPE of the underlying organic layer 12 as shown in FIG. 8. A material for the underlying organic layer is a charge-transporting organic compound forming an organic layer such as a hole injection layer, a hole transport layer, a hole blocking layer, an electron transport layer, and an electron injection layer.

The method for producing an organic EL panel can include a step of forming at least one organic layer (underlying organic layer 12) made of a charge-transporting organic compound that spreads over each of the stacking bodies and gaps between the stacking bodies.

Figure 9:
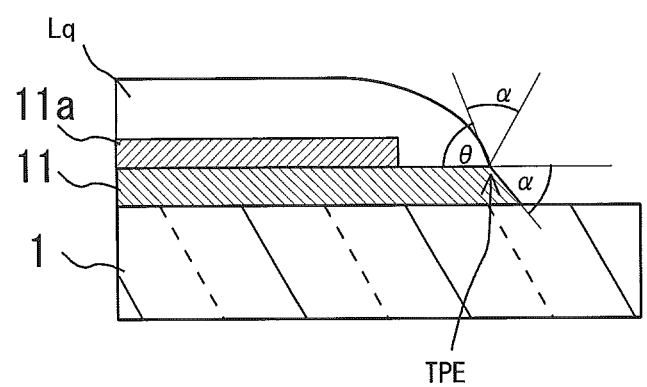
FIG. 9 is a schematic partial cross-sectional view of a sample substrate on which films of a first electrode and a first auxiliary electrode are formed.

The present inventor has made a sample substrate in which as shown in FIG. 9, a first electrode 11 having an angled edge portion TPE is formed on a substrate 1 and a first auxiliary electrode 11a is formed on the first electrode 11. As confirmed from the experiment results in the same manner as described above, the pinning effect of the coating liquid Lq is maintained at the angled edge portion TPE of the first electrode 11 of the underlying layer as shown in FIG. 9. Thus, a multi-layered structure of two or more layers can be produced as the first electrode. For example, a first electrode 11 of an underlying layer is made of aluminum having good processability and a first auxiliary electrode 11a of an upper layer is made of ITO having poor processability to form a first electrode with a two-layer structure. In this case, when the area of the underlying aluminum layer is larger than that of the ITO upper layer, the surface roughness at the edge of the ITO upper layer is poor. Therefore, the coating liquid Lq is unlikely to stop at the edge. However, the coating liquid Lq can stop at the edge of the angled edge portion TPE of the underlying aluminum layer.

In the method for producing an organic electroluminescent panel, it is preferable that the first step include a step of stacking a plurality of conductive films as the first electrode and the area of the top face of a conductive film having the angled edge portion among the plurality of conductive films be larger than that of the other conductive films.

Further, the present inventor has measured the surface roughness Ra (arithmetic average roughness) of the first electrode in the plurality of substrates with a surface roughness measurement device (JIS B0601). At this time, when the surface roughness Ra of the first electrode of ITO exceeds 50 nm, the inventor has observed that the pinning effect does not act. Further, in a first electrode formed of another metal, the pinning effect is expressed at an Ra of 30 nm or less, and preferably 10 nm or less. Therefore, a first electrode having a surface roughness Ra on an angled edge portion of 30 nm or less is preferably used.

EXAMPLES

An organic EL panel with a light-emitting pattern of 100 mm×100 mm was produced.

Each of the organic EL elements had a line length of 100 mm and a line width of 450 and each of the elements had 200 lines that are arrayed parallel to one another with a sub-pitch of 500 μm (line and space are 450 μm and 50 μm, respectively).

RGB light-emitting layers with a sub-pitch of 500 μm were separately coated to form an array of organic EL elements that use other organic layers and electrodes as a common configuration and were alternatively arrayed in the order of RGB.

In the produced organic EL panel, the sub-pitch Sp of each organic EL element was 500 μm, the width OW of an aperture was 450 μm, and the aperture ratio (OW/Sp) was 90%. The organic EL panel emitted light brightly as compared with a conventional one.

The configuration of the organic EL panel produced is shown in Table 1.

TABLE 1

| | Film formation | Material | Film thickness (nm) |
|---|---|---|---|
| First electrode | Sputtering and photolithography | Al | 100 |
| First auxiliary electrode (anode) | Sputtering and photolithography | ITO | 50 |
| Hole injection layer and transport layer | Inkjet | PEDOT:PSS aqueous solution: Solid content concentration 1 wt %. | 30 |
| Light-emitting layer R | Inkjet | Xylene solution: Solid content concentration 2 wt %, Host BAlq, Dopant HexIr(phq)3. | 40 |

TABLE 1-continued

| | Film formation | Material | Film thickness (nm) |
|---|---|---|---|
| Light-emitting layer G | Inkjet | Xylene solution: Solid content concentration 2 wt %, Host CBP, Dopant Ir(ppy)3. | 40 |
| Light-emitting layer B | Inkjet | Xylene solution: Solid content concentration 2 wt %, Host CBP, Dopant FIr(pic). | 40 |
| Electron transport layer | Vapor deposition | Alq3 | 30 |
| Second electrode (cathode) | Vapor deposition | MgAg | 50 |

PEDOT:PSS: Poly(3,4-ethylenedioxythiophene) poly(styrenesulfonate)
BAlq: Bis(2-methyl-8-quinolinolato) (p-phenylphenolato) aluminum
HexIr(phq)3: Tris[2-(4-n-hexylphenyl)quinoline)] iridium(III)
CBP: 4,4'-Bis(9H-carbazol-9-yl)biphenyl
Ir(ppy)3: Tris(2-phenylpyridine) iridium(III)
FIr(pic): Bis(2,4-difluorophenylpyridinato) (2-carboxypyridyl)iridium (III)

REFERENCE SIGNS LIST

1 Substrate
3 Hole injection layer
4 Hole transport layer
5 Light-emitting layer
6 Hole blocking layer
7 Electron transport layer
8 Electron injection layer
9 Cathode (second electrode)
11 First Electrode
11a First auxiliary electrode (anode)

The invention claimed is:

1. A method for producing an organic electroluminescent panel, comprising:
    a first step of arraying and distributing a plurality of first electrodes on or above a substrate;
    a second step of forming stacking bodies each composed of a plurality of organic layers including a light-emitting layer on or above respective top faces of the first electrodes; and
    a third step of forming organic electroluminescent elements by forming second electrodes respectively on or above the stacking bodies,
    wherein
        in the first step the first electrode is a conductive body having an angled edge portion forming a edge line surrounding the top face itself and
        the second step includes a step of, by an inkjet method in which at least a liquid having a fight-emitting organic material is ejected from a nozzle, coating the top face with the liquid in such a total amount that a film of the coated liquid does not pass through the angled edge portion to stop the coated liquid at the angled edge portion.

2. The method for producing an organic electroluminescent panel according to claim 1, wherein an inner angle of the angled edge portion is 45° to 165°.

3. The method for producing an organic electroluminescent panel according to claim 1, wherein the second step includes a step of forming at least one organic layer of a non-light-emitting organic material that spreads over a distribution region of the first electrode.

4. The method for producing an organic electroluminescent panel according to claim 1, wherein the first step includes a step of stacking a plurality of conductive films to form the first electrode, and the area of a top face of one conductive film of the plurality of conductive films is larger than that of the other conductive films.

5. The method for producing an organic electroluminescent panel according to claim 1, wherein a surface roughness Ra of the angled edge portion is 30 nm or less.

6. The method for producing an organic electroluminescent panel according to claim 1, wherein the second step includes a step of moving the nozzle along an array of the first electrodes relative to the substrate.

7. An organic electroluminescent panel comprising organic electroluminescent elements,
wherein
the organic electroluminescent elements include
a plurality of first electrodes that are arrayed and formed on a substrate;
stacking bodies each including a plurality of organic layers that are stacked on the top face of each of the first electrodes and include a light-emitting layer; and
second electrodes formed on the respective stacking bodies,
wherein
each of the first electrodes is a conductive body having an angled edge portion forming a edge line surrounding the top face itself and
the light-emitting layer is formed of dried material derived from at least a liquid having a light-emitting organic material with which coated the top face in such a total amount that a film of the coated liquid does not pass through the angled edge portion to stop the coated liquid at the angled edge portion by an inkjet method in which the liquid is ejected from a nozzle.

* * * * *